US006229083B1

(12) United States Patent
Edelson

(10) Patent No.: US 6,229,083 B1
(45) Date of Patent: May 8, 2001

(54) THERMIONIC GENERATOR

(75) Inventor: Jonathan Sidney Edelson, North Plains, OR (US)

(73) Assignee: Borealis Technical Limited (GI)

( * ) Notice: Subject to any disclaimer, the term of this patent is extended or adjusted under 35 U.S.C. 154(b) by 0 days.

(21) Appl. No.: 09/451,509

(22) Filed: Nov. 30, 1999

Related U.S. Application Data

(63) Continuation-in-part of application No. 08/790,753, filed on Jan. 27, 1997, now Pat. No. 5,994,638, which is a continuation-in-part of application No. 08/770,674, filed on Dec. 20, 1996, now abandoned.

(51) Int. Cl.[7] .................................................... H01L 35/34
(52) U.S. Cl. .......................... 136/201; 310/306; 322/2 R
(58) Field of Search .................................... 136/201, 202; 310/301, 302, 305, 306; 322/2 R

(56) References Cited

PUBLICATIONS

Sealed vacuum electronic devices by surface micromachining, Zurn, S.; Mei, Q.; Ye, C.; Tamagawa, T.; Polla, D.L.; Electron Devices Meeting, 1991. Technical Digest., Internal, 1991, pp. 205–208. No month available.*

Micromachined Devices and Fabrication Technologies, Bart, Stephen F.; Judy, Michael W., J. Webster (ed.), Wiley Encyclopedia of Electrical and Electronics Engineering Online, copyright 1999 by John Wiley & Sons, Inc. No month available.*

* cited by examiner

*Primary Examiner*—Kathryn Gorgos
*Assistant Examiner*—Thomas H Parsons

(57) ABSTRACT

A method for building a thermionic converter comprises providing an electrode and creating a central depression of substantially uniform depth on a face of the electrode. A surface of the central depression is coated with a layer comprising a thermionic material. A second electrode comprising a face is also provided, wherein the face of the second electrode comprises a central depression of substantially uniform depth, wherein the central depression is coated with a layer comprising a thermionic material.

28 Claims, 7 Drawing Sheets

THERMIONIC GENERATOR

REFERENCE TO RELATED APPLICATIONS

This application is a continuation-in-part of U.S. application Ser. No. 08/790,753, filed on Jan. 27, 1997 and issued as U.S. Pat. No. 5,994,638 on Nov. 30, 1999, herein incorporated by reference, which is a continuation-in-part of U.S. application Ser. No. 08/770,674, filed Dec. 20, 1996 (now abandoned), herein incorporated by reference.

BACKGROUND OF THE INVENTION

1. Field of the Invention

The present invention is related to thermionic generators, and in particular to thermionic generators fabricated using micromachining methods.

2. Description of The Related Art

Most electricity is generated at a power station by a process in which heat is used to convert water to steam. The steam expands through a turbine device causing it to rotate. This powers a generator unit, which produces electricity. The heat is provided by burning a fuel such as coal, oil, gas, or wood, or from nuclear, solar or geothermal energy.

On a smaller scale, the generator unit may be powered by an internal combustion engine, such as a diesel or petrol driven motor. Similarly, the alternator used with the internal combustion engine in every type of automobile for providing electricity to the vehicle is powered by the rotating drive shaft of the engine.

All these devices use moving parts which are subject to friction and wear, and only a percentage of the heat generated is converted into electricity.

The thermionic generator, a device for converting heat energy to electrical energy, was first proposed by Schlieter in 1915. This device depends on emission of electrons from a heated cathode. In a thermionic generator, the electrons received at the anode flow back to the cathode through an external load, effectively converting the heat energy from the cathode into electrical energy at the anode. Voltages produced are low, but Hatsopoulos (U.S. Pat. No. 2,915,652), herein incorporated by reference, has described a means of amplifying this output.

One of the problems associated with the design of thermionic converters is the space-charge effect, which is caused by the electrons as they leave the cathode. The emitted electrons have a negative charge which deters the movement of other electrons towards the anode. Theoretically, the formation of the spacecharge potential barrier may be prevented in at least two ways: the spacing between the electrodes may be reduced to the order of microns, or positive ions may be introduced into the cloud of electrons in front of the cathode. Additionally, in practice, more difficulties remain, such as having low efficiency, costly to fabricate, and, particularly in the high-pressure ignited mode, do not have a long life.

SUMMARY OF THE INVENTION

From the foregoing, it may be appreciated that a need has arisen for a thermionic generator which is easy to fabricate, inexpensive, reliable, of high efficiency and having an extended life. In accordance with one embodiment of the present invention, a method for building a thermionic converter comprises: providing an electrode; creating a central depression of substantially uniform depth on a face of said electrode; and coating a surface of said central depression with a layer comprising a thermionic material.

In accordance with another embodiment of the present invention, a method for building a thermionic converter using a micromachinging technique comprising the steps of: providing an electrode; creating a central depression of substantially uniform depth on a face of said electrode using a micromaching technique; coating a surface of said central depression with a layer comprising a thermionic material; and providing a second electrode comprising a face, wherein said face of said second electrode comprises a central depression of substantially uniform depth, wherein said central depression of said second electrode is coated with a layer comprising a thermionic material.

In accordance with another embodiment of the present invention, a method for converting heat to electricity comprises: providing a thermionic converter comprising: a first electrode, wherein a face of said first electrode comprises a central depression of substantially uniform depth, wherein said first electrode further comprises a coating of thermionic material on said central depression; an edge region on said first electrode comprising a channel cut along two opposing sides of said central depression; a second electrode, wherein a face of said second electrode comprises a central depression of substantially uniform depth, wherein said second electrode further comprises a coating of thermionic material; and an edge region on said second electrode comprising a channel cut along two opposing sides of said central depression, wherein said first electrode is joined with said second electrode, wherein said edge region in said first electrode is in contact with said edge region in said second electrode; providing a gap between said thermionic material on said first electrode and said thermionic material on said second electrode; connecting an electrical load to said thermionic converter; and allowing electrons to flow from said thermionic material of said first electrode to said thermionic material of said second electrode.

The present invention discloses a thermionic generator having close spaced electrodes and constructed using microengineering techniques. The present invention utilizes, in one embodiment, the technique known as MicroElectroMechanical Systems, or MEMS, to construct a thermionic generator. The present invention further utilizes, in another embodiment, microengineering techniques to construct a thermionic generator by wafer bonding. The present invention further utilizes, in another embodiment, the technique known as MicroElectroMechanical Systems, or MEMS, to construct a thermionic generator by wafer bonding.

A technical advantage of the present invention is to provide a thermionic generator constructed using micromachining techniques. Another technical advantage of the present invention is that the thermionic generator may be constructed easily in an automated, reliable and consistent fashion.

A still another technical advantage of the present invention is that the thermionic generator may be manufactured inexpensively. A yet another technical advantage of the present invention is that the thermionic generator may be manufactured in large quantities.

Another technical advantage of the present invention is that electricity may be generated without any moving parts.

Still another technical advantage of the present invention is to provide a thermionic generator in which the electrodes are close-spaced. A further technical advantage of the present invention is that the thermionic generator has reduced spacecharge effects.

A yet further technical advantage of the present invention is that the thermionic generator may operate at high current densities. Another technical advantage of the present invention is to provide a thermionic generator using new electrodes having a low work function.

An additional technical advantage of the present invention is that electricity may be generated from heat sources of 1000K or less. A still additional technical advantage of the present invention is that waste heat may be recovered.

Yet another technical advantage of the present invention is to provide a thermionic generator which produces electricity at lower temperatures than those known to the art.

A still additional technical advantage of the present invention is that a variety of heat sources may be used. Another technical advantage of the present invention is that electricity may be generated where needed rather than at a large power station.

A technical advantage of the present invention is that electricity may be generated using nuclear power, geothermal energy, solar energy, energy from burning fossil fuels, wood, waste or any other combustible material. Still another technical advantage of the present invention is to provide a thermionic generator which can replace the alternator used in vehicles powered by internal combustion engines.

A further technical advantage of the present invention is that the efficiency of the engine is increased. Another technical advantage of the present invention is to provide a thermionic generator which has no moving parts. A yet another technical advantage of the present invention is that maintenance costs are reduced.

Other technical advantages of the present invention will be readily apparent to one skilled in the art from the following figures, descriptions, and claims.

BRIEF DESCRIPTION OF DRAWINGS

For a more complete understanding of the present invention and the technical advantages thereof, reference is now made to the following description taken in conjunction with the accompanying drawings, in which.

DETAILED DESCRIPTION OF INVENTION

Figure 1A:
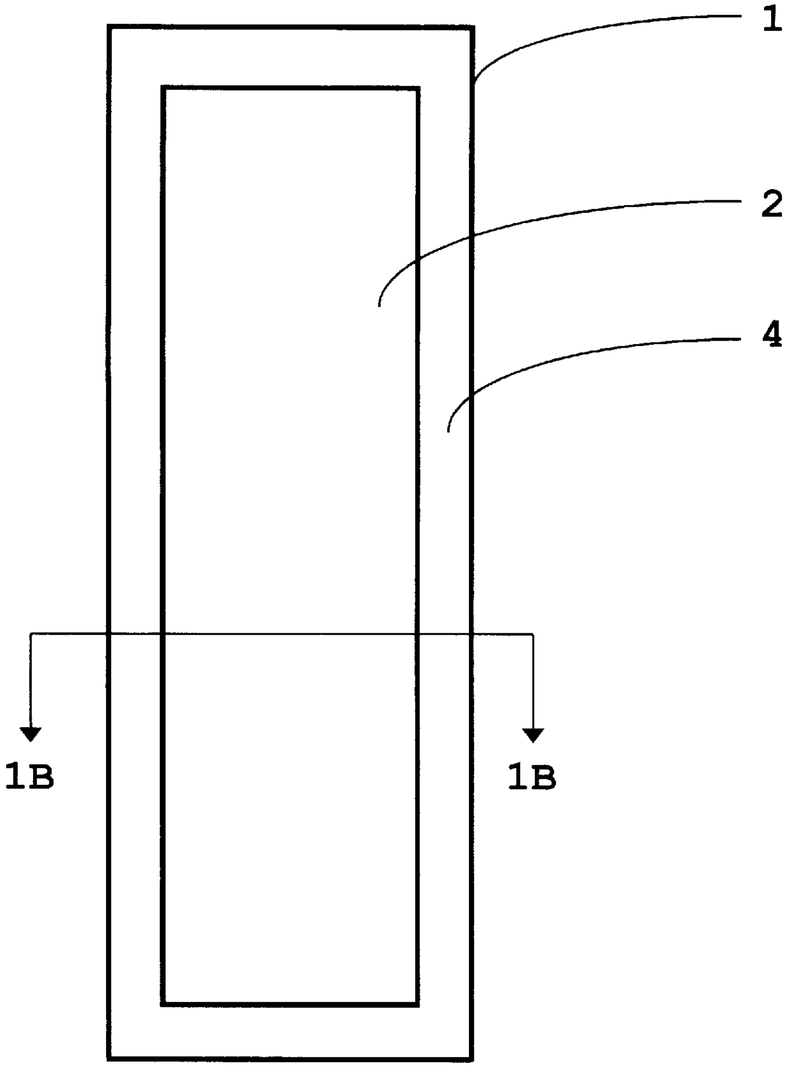
FIGS. 1A, 1B, 2A, 2B, 3A, 3B, 4A, 4B, 5A, 5B, and 5C illustrate, with like numerals referring to the same elements, an embodiment of the present invention and shows in a schematic fashion the fabrication of a thermionic device which uses a combination of silicon micromachining and wafer bonding techniques.

The following description describes a preferred embodiment of the invention and should not be taken as limiting the invention. Other embodiments obvious to those skilled in the art are included in the present invention.

Applicant has prior applications in this field, including the applications mentioned above and U.S. application Ser. No. 08/498,199, filed Jul. 5, 1995, herein incorporated by reference.

The method and apparatus of the present invention has numerous applications. For example, the alternator of the automobile could be replaced by a thermionic generator using the heat contained in the exhaust gases as a source of energy, which would lead to an increase in the efficiency of the engine. Another application is in domestic and industrial heating systems. These systems need a pump to circulate heated water around the system, which requires a source of power. The control circuitry regulating the temperature of the building being heated also requires power. These could both be supplied by a thermionic generator powered by the hot flue gases.

A further application utilizes heat generated by solar radiation. This could either be in space or earth-based solar power stations, or on the roof of buildings to supply or augment the power requirements of the building.

The present invention addresses problems associated with the construction of the close-spaced thermionic generator by applying design approaches, such as MicroElectronicMechanicalSytems (MEMS) and MEMCad, and microengineering techniques, which have not previously been applied to this field.

Microengineering refers to the technologies and practice of making three dimensional structures and devices with dimensions in the order of micrometers or smaller. The two constructional technologies of microengineering are microelectronics and micromachining.

Microelectronics, producing electronic circuitry on silicon chips, is known. Micromachining is the technique used to produce structures and moving parts for microengineered devices. One of the main goals of microengineering is to be able to integrate microelectronic circuitry into micromachined structures, to produce completely integrated systems. Such systems could have the same advantages of low cost, reliability and small size as silicon chips produced in the microelectronics industry.

Silicon micromachining techniques, used to shape silicon wafers and to pattern thin films deposited on silicon wafers, are known. Common film materials include silicon dioxide (oxide), silicon nitride (nitride), polycrystalline silicon (polysilicon or poly), and aluminum. They can be patterned using photolithographic and known wet etching techniques. Other materials, including noble metals such as gold, can also be deposited as thin films and are often patterned by a method known as "lift off."

Dry etching techniques, which are more amenable to automation, are also used. One form is reactive ion etching. Ions are accelerated towards the material to be etched, and the etching reaction is enhanced in the direction of travel of the ion. Deep trenches and pits (up to ten or a few tens of microns) of arbitrary shape and with vertical walls can be etched in a variety of materials including silicon, oxide and nitride. Another approach is to use the electrochemical passivation technique. A wafer with a particular impurity concentration is used, and different impurities are diffused, or implanted, into the wafer. This is done to form a diode junction at the boundary between the differently doped areas of silicon. The junction will delineate the structure to be produced. An electrical potential is then applied across the diode junction, and the wafer is immersed in a suitable wet etch. This is done in such a way that when the etch reaches the junction an oxide layer (passivation layer) is formed which protects the silicon from further etching.

Combinations of the above techniques may be used for surface micromachining to build up the structures in layers of thin films on the surface of the silicon wafer. This approach typically employs films of two different materials, a structural material (commonly polysilicon) and a sacrificial material (oxide). These are deposited and dry etched in sequence. Finally, the sacrificial material is wet etched away to release the structure. Structures made by this approach include cantilever beam, chambers, tweezers, and gear trains.

Larger more complex devices can also be formed by bonding micromachined silicon wafers together, or to other substrates. One approach is anodic bonding. The silicon wafer and glass substrate are brought together and heated to a high temperature. A large electric field is applied across that junction, which causes an extremely strong bond to form between the two materials. Other bonding methods include using an adhesive layer, such as a glass or photoresist. While anodic bonding and direct silicon bonding form strong bonds, these two bonding methods work best when the surfaces to be joined are flat and clean.

An alternative to using photolithographic and wet etching techniques is the use of excimer laser micromachining. These lasers produce relatively wide beams of ultraviolet laser light. One interesting application of these lasers is their use in micromachining organic materials (plastics, polymers, etc.). The absorption of a UV laser pulse of high energy causes ablation, which removes material without burning or vaporizing it, so the material adjacent to the area machined is not melted or distorted by the heating. The shape of the structures produced is controlled by using a chrome on quartz mask, and the amount of material removed is dependent on the material itself, the length of the pulse, and the intensity of the laser light. Relatively deep cuts of hundreds of microns deep can be made using the excimer laser. Structures with vertical or tapered sides can also be created.

A further approach is LIGA (Lithographie, Galvanoformung, Abformung). LIGA uses lithography, electroplating, and molding processes to produce microstructures. It is capable of creating very finely defined microstructures of up to 1000 μm high. The process uses X-ray lithography to produce patterns in very thick layers of photoresist and the pattern formed is electroplated with metal. The metal structures produced can be the final product, however it is common to produce a metal mold. This mold can then be filled with a suitable material, such as a plastic, to make the finished product in that material. The X-rays are produced from a synchrotron source, which makes LIGA expensive. Alternatives include high voltage electron beam lithography which can be used to produce structures of the order of 100 μm high, and excimer lasers capable of producing structures of up to several hundred microns high.

These techniques are coupled with computer-aided design and manufacture in MicroElectroMechanical Systems, or MEMS. This enabling technology includes applications such as accelerometers, pressure, chemical and flow sensors, micro-optics, optical scanners, and fluid pumps, all of which are integrated micro devices or systems combining electrical and mechanical components. They are fabricated using integrated circuit batch processing techniques and can range in size from micrometers to millimeters. These systems can sense, control and actuate on the micro scale, and function individually or in arrays to generate effects on the macro scale.

Figure 1B:
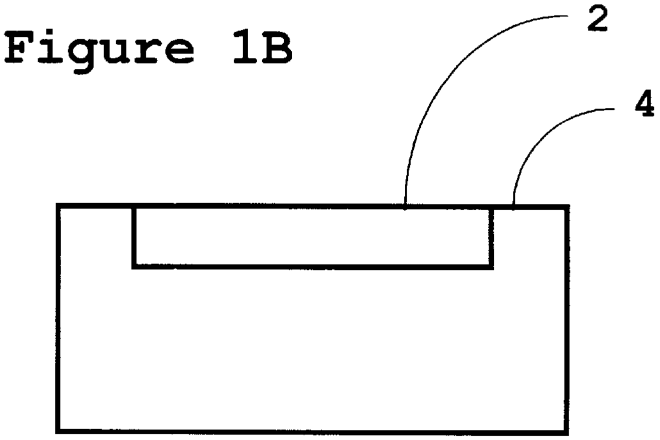
Figure 2A:
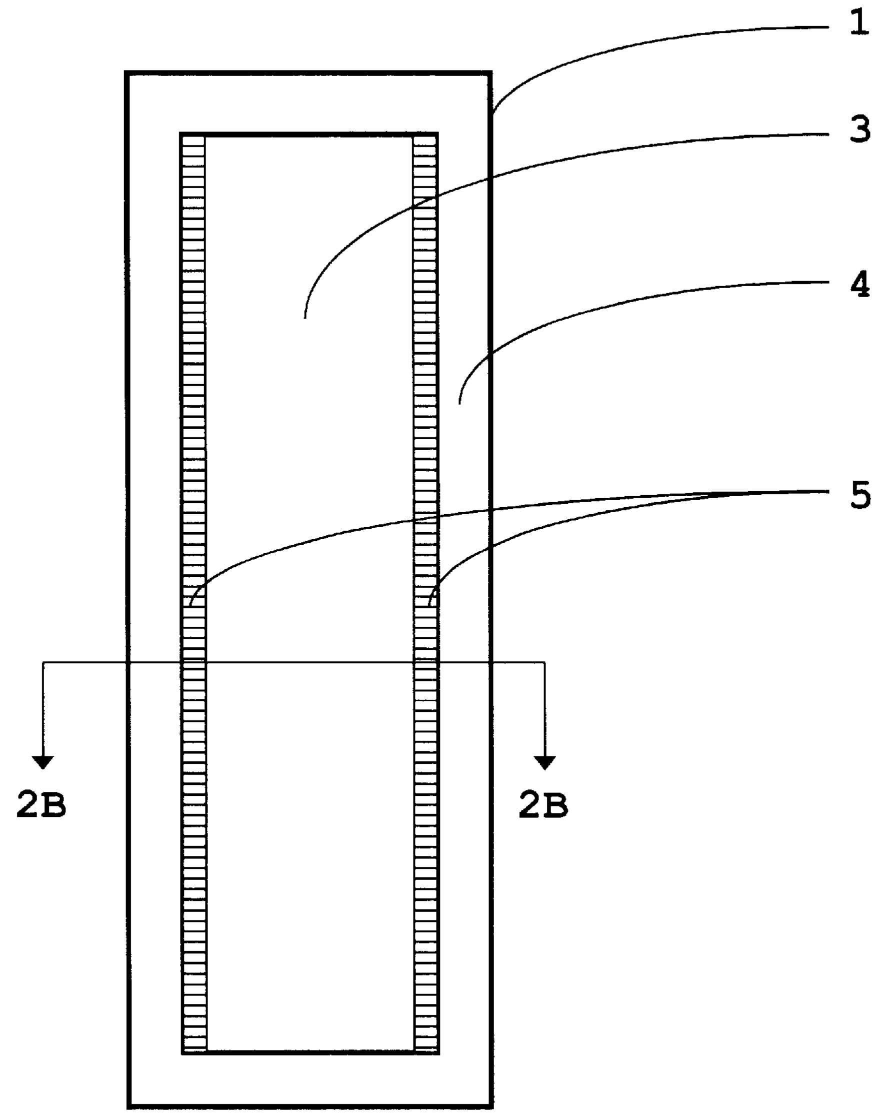
Figure 2B:
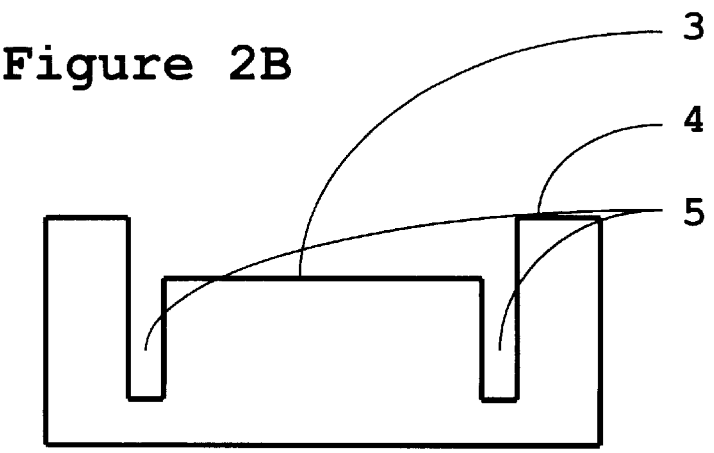

Referring to FIG. 1, a silicon wafer 1 is oxidized to produce an oxide layer 2 about 0.5 μm deep on part of its surface. Oxide layer 2 covers a long thin region in the center of wafer 1, surrounded by an edge region 4. The wafer is treated to dissolve the oxide layer, leaving a depression 3 on the surface of the wafer which is about 0.5 μm deep (FIG. 2), surrounded by edge region 4. Two parallel saw cuts, 5, are made into the wafer along two opposing edges of the depression (FIG. 2).

Figure 3A:
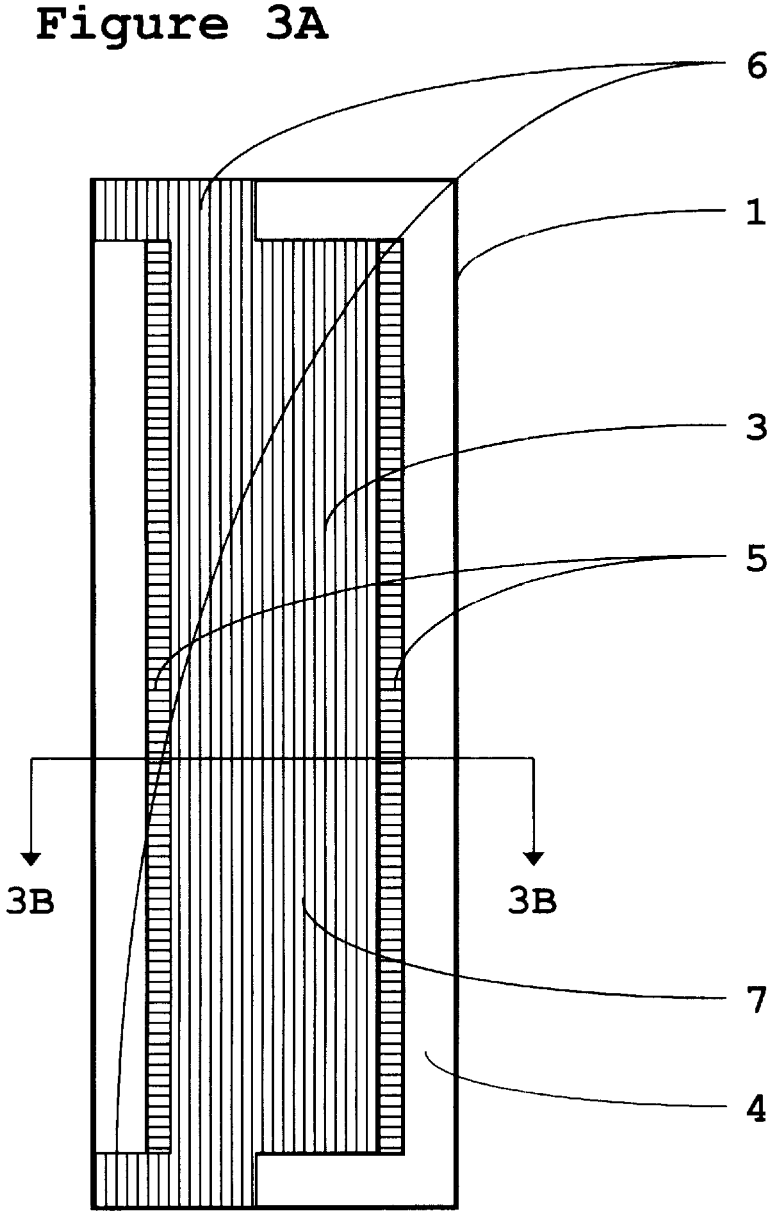
Figure 3B:
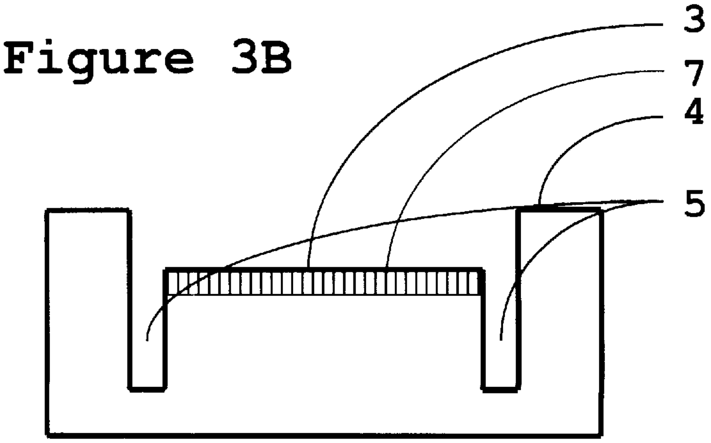

The next stage involves the formation of means for an electrical connection (FIG. 3). The floor of depression 3, and two tabs 6 on edge region 4 of wafer 1 at right angles to saw cuts 5 are doped for conductivity to form a doped region 7.

Figure 4A:
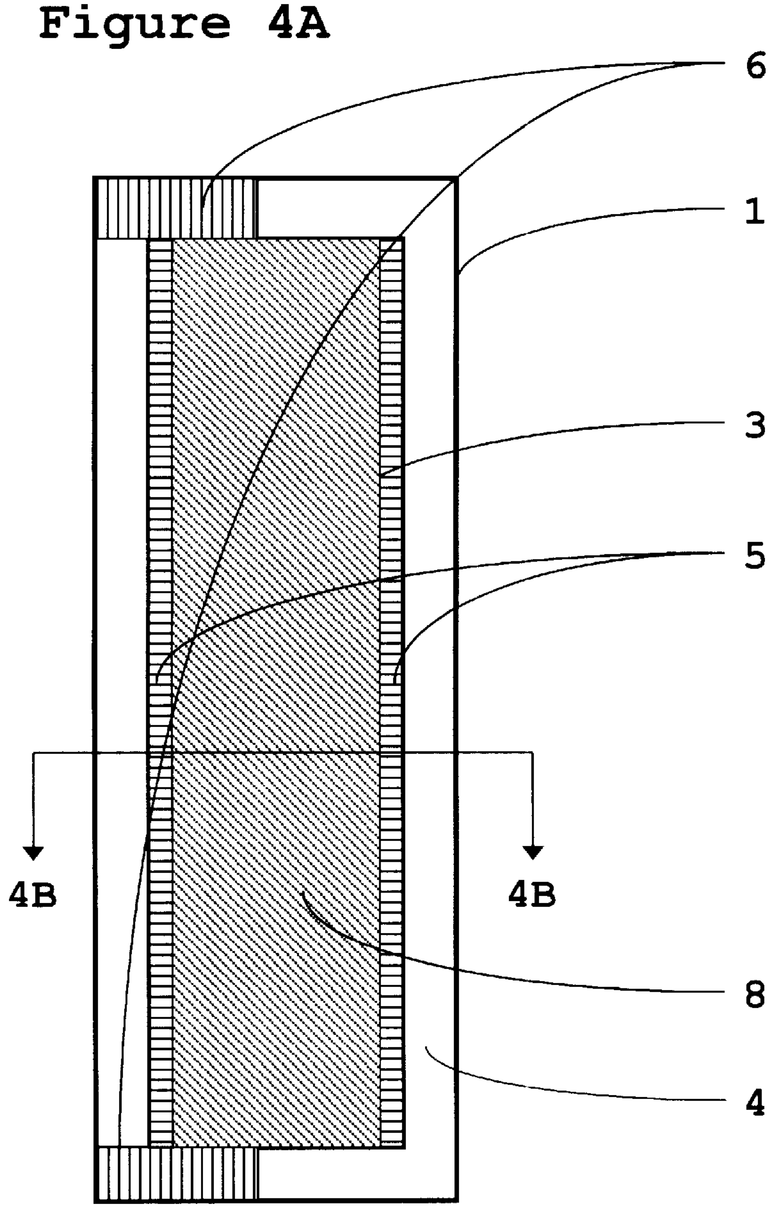
Figure 4B:
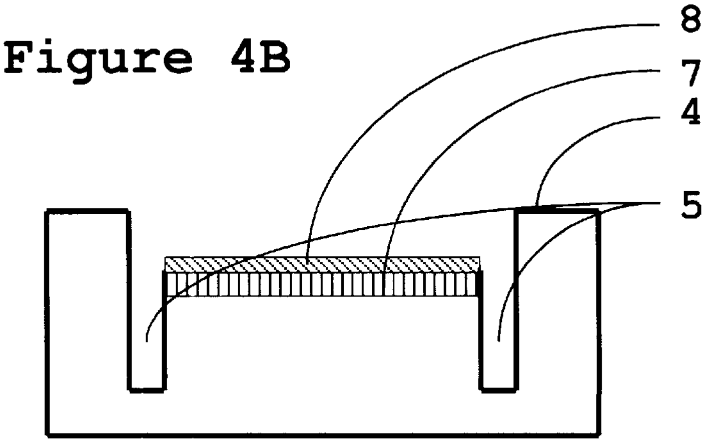

A coating 8 is formed by depositing material, preferably silver, on a surface of depression 3, preferably by vacuum deposition, using low pressure and a non-contact mask to keep edge regions 4 clean (FIG. 4). A second wafer is treated in like manner. Coating 8 may be a layer of any thermionic material, otherwise known as a thermionic emissive material.

Figure 5A:
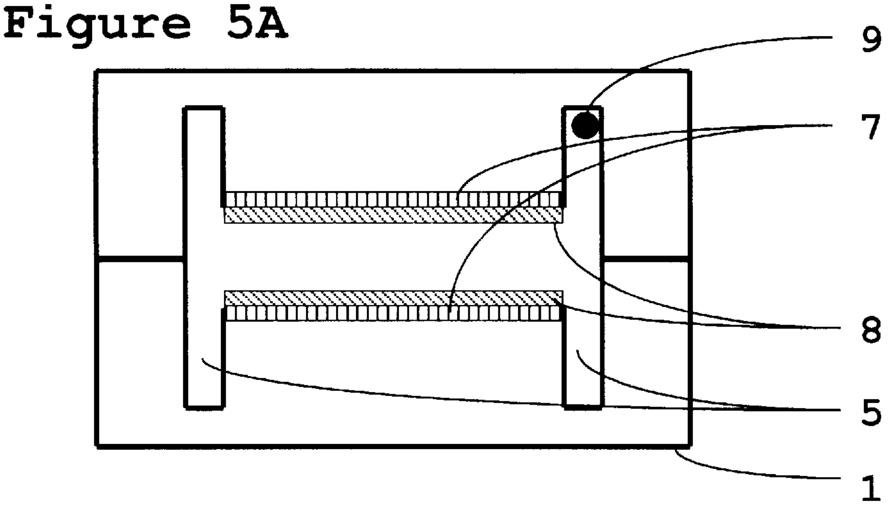
Figure 5B:
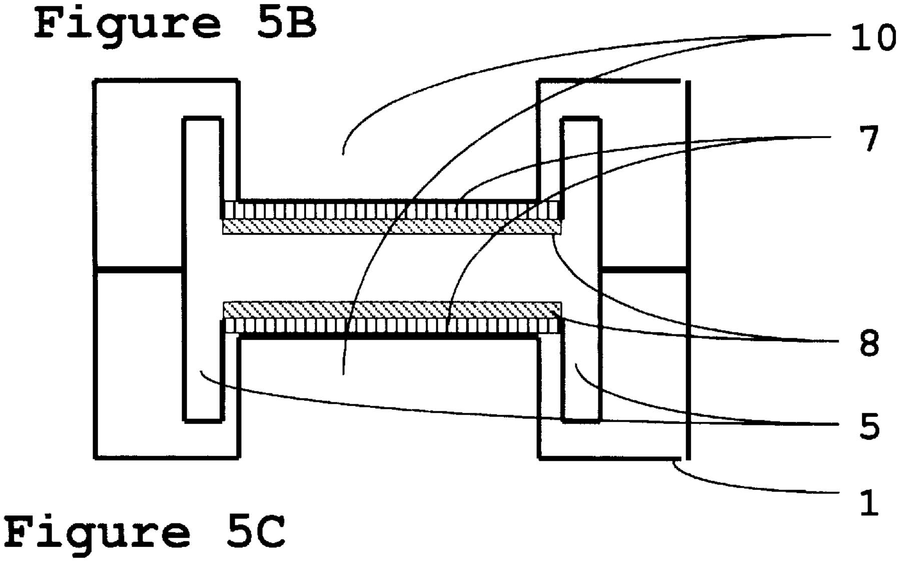

Referring now to FIG. 5, cesium 9 is placed in one of cut channels 5 of one of the wafers. Both wafers are flushed with oxygen and joined together so that edge region 4 of both wafers touch. The structure is then annealed at 1000° C., which fuses the wafers together and vaporizes the cesium (FIG. 5*a*). The oxygen oxidizes the preferred silver coating to give a silver oxide surface, and the cesium cesiates the silver oxide surface. This forms two electrodes. These steps also serve to form a vacuum in the gap between the wafers, such that the gap is evacuated. When it is stated that the gap may be evacuated, it also means that the gap may be substantially evacuated, e.g., there may be an insignificant amount of air in the gap such that the gap is sufficiently evacuated. Thus, by a vacuum, it is meant a space in which the pressure is far below normal atmospheric pressure so that the remaining gasses do not affect processes being carried on in the space.

The gap between the electrodes may be evacuated or filed with a low pressure gas, such as cesium vapor, or an inert gas. Moreover, the gap is preferably 10.0 μm or less and more preferably 1.0 μm or less.

Figure 5C:
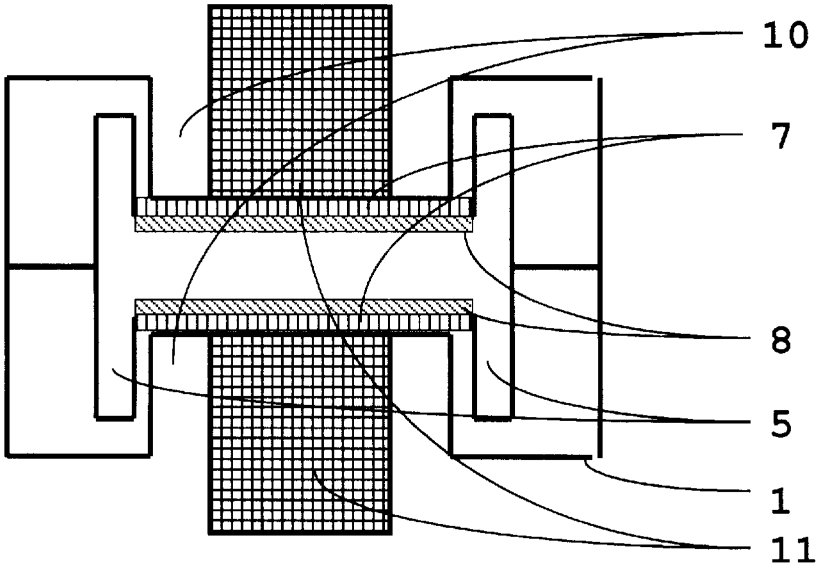

Further saw cuts, 10, are made in the back of the joined wafers (see FIG. 5*b*) and the center of the space which is formed is filled with solder 11 (see FIG. 5*c*). The device is annealed to attach the solder and remove stress.

Figure 7A:
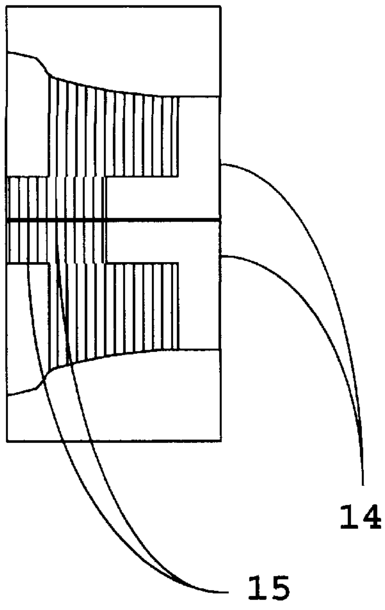
FIGS. 7A, 7B, 7C, and 7D illustrate embodiments of the joining of the thermionic device of the present invention to form an array of cells.
Figure 7B:
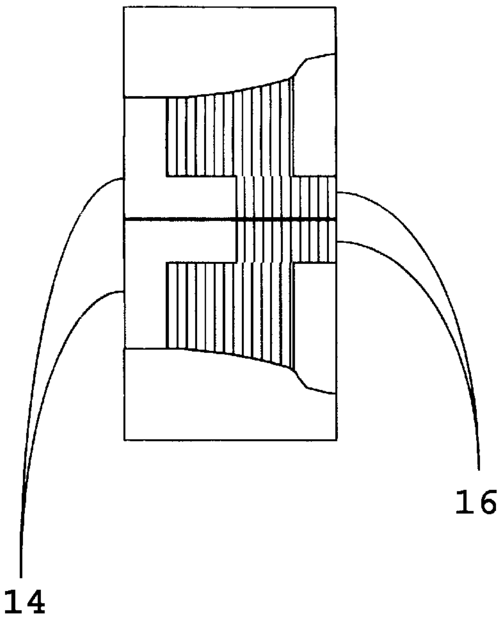
Figure 7C:
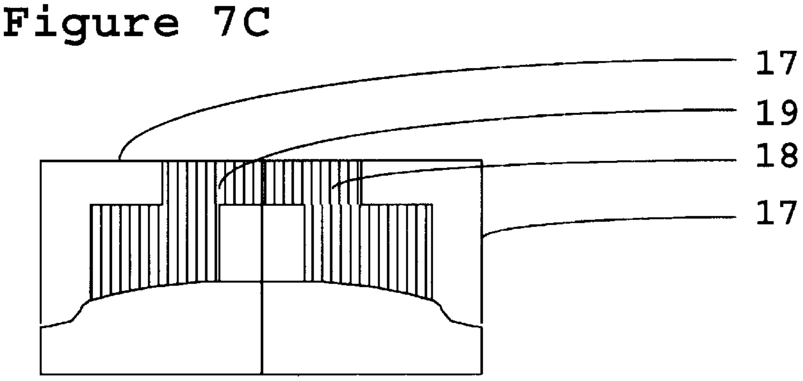
Figure 7D:
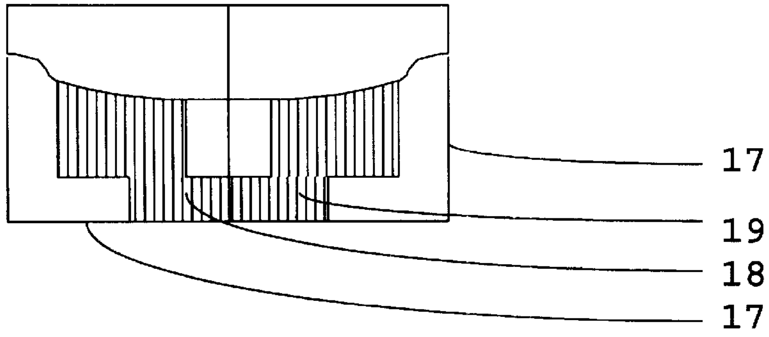

This micromachining approach provides a thermionic converter cell. A number of these may be joined together such that by overlapping doped tabs 3 (FIG. 7), there will be electrical conductivity from the doped region of one cell to the doped region of an adjacent cell. Thus FIGS. 7A and 7B show how thermionic converter cells 14 of the present invention may be joined end to end: the lower tab of one cell 15 is in electrical contact with the lower tab of the adjacent cell 15 (FIG. 7A), and the upper tabs 16 are similarly in electrical contact (FIG. 7B). FIGS. 7C and 7D show how thermionic converter cells 17 of the present invention may be joined side to side: the lower tab 18 of one cell is in contact with the upper tab 19 of the adjacent cell. Several such cells may be fabricated upon a single substrate, thereby producing a lower current, higher voltage device.

Figure 6:
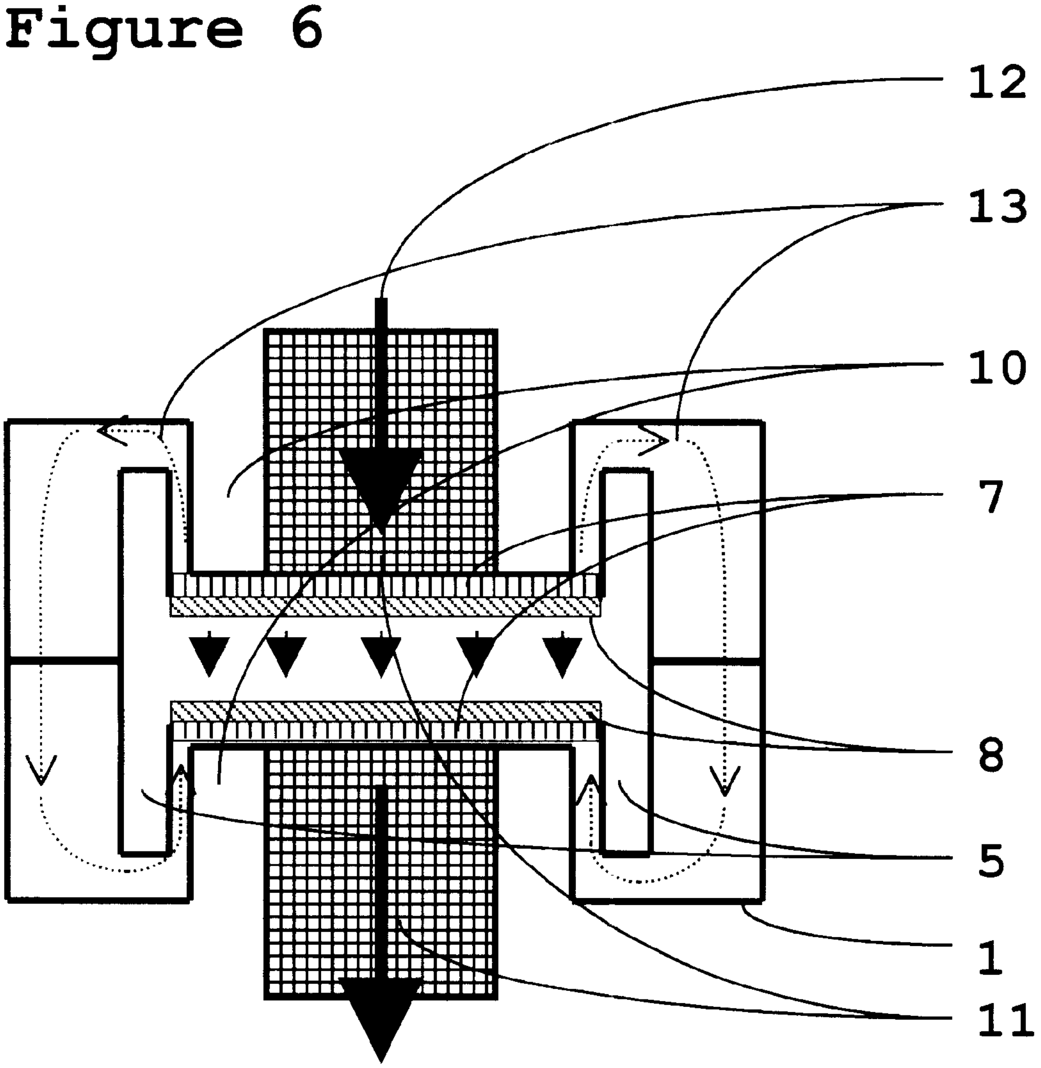
FIG. 6 illustrates the heat flows in one embodiment of the thermionic device of the present invention.

Referring to FIG. 6, solder bars 11 provide thermal contact between the heat source and the cathode, or emitter, and between the heat sink and the anode, or collector.

Saw cuts 5 are provided to achieve thermal insulation between the hot side of the device and the cold side. The desired heat conduction pathway 12 is along solder bar 11 to the cathode, or emitter electrode, across the gap (as thermionically emitted electrons) to the anode, or collector electrode, along the other solder bar 11 to the heat sink. Undesirable heat conduction pathway 13 occur as heat is conducted along silicon wafer 1 away from solder bar 11, around saw cut 5, across the fused junction between the wafers, and around the saw cut 5 in the other wafer. This pathway for the conduction of heat is longer than the desired heat conduction pathway via the electrodes, and as silicon is a poor conductor of heat, heat losses are thereby minimized.

In another preferred embodiment, silicon wafer 1 is mounted on a thermal insulating material. When saw cuts 5 are made, these cut through the silicon wafer and into the thermal insulating material. This produces a device in which undesirable heat conduction through the device is reduced: as heat is conducted along the silicon wafer away from solder bars 11 and around saw cut 5, it has to pass through a thermal insulator region.

The foregoing describes a single thermionic converter formed by micromachining techniques from a pair of fused wafers. In another preferred embodiment, more than one thermionic converter "cell" is formed from each pair of wafers. In this embodiment (FIGS. 7C and 7D) the tabs 18 and 19 of adjoining cells touch so that each anode of one cell is connected to the cathode of an adjacent cell, forming a series circuit.

In other preferred embodiments, electrode coating 8 may be provided by other thermionic materials, including but not limited to cesium, molybdenum, nickel, platinum, tungsten, cesiated tungsten, bariated tungsten, thoriated tungsten, the rare earth oxides (such as barium and strontium oxides), and carbonaceous materials (such as diamond or sapphire). In addition, the electrode coating 8 may be other thermionic materials, such as an alkali metal, an alloy of alkali metals, or an alloy of alkali metal and other metals, an alkaline earth metal, a lanthanide metal, an actinide metal, alloys thereof, or alloys with other metals, which is coated with a complexing ligand to form an electride material. The complexing ligand may be 18-Crown-6, also known by the IUPAC name 1,4,7,10,13,16-hexaoxacyclooctadecane, 15-Crown-5, also known by the IUPAC name 1,4,7,10,13-pentoxacyclopentadecane, Cryptand [2,2,2], also known by the IUPAC name 4,7,13,16,21,24-hexoxa-1,10-diazabicyclo [8,8,8] hexacosane or hexamethyl hexacyclen. Electride materials are of benefit in this application because of their low work functions.

The essence of the present invention is the use of micromachining techniques to provide thermionic converter cells having close-spaced electrodes. Specific electrode materials have been described, however other materials may be considered.

While this invention has been described with reference to numerous examples and embodiments, it is to be understood that this description is not intended to be construed in a limiting sense. Various modifications and combinations of the illustrative embodiments will be apparent to persons skilled in the art upon reference to this description. It is to be further understood, therefore, that numerous changes in the details of the embodiments of the present invention and additional embodiments of the present invention will be apparent to, and may be made by, persons of ordinary skill in the art having reference to this description. It is contemplated that all such changes and additional embodiments are within the spirit and true scope of the invention as claimed below.

All publications and patent applications mentioned in this specification are indicative of the level of skill of those skilled in the art to which this invention pertains. All publications and patent applications are herein incorporated by reference to the same extent as if each individual publication or patent application was specifically and individually indicated to be incorporated by reference.

I claim:

1. A method for building a thermionic converter comprising the steps of:

providing an electrode;

creating a central depression of substantially uniform depth on a face of said electrode; and coating a surface of said central depression with a layer comprising a thermionic material.

2. The method of claim 1, further comprising creating an edge region, wherein said edge region comprises a channel cut along two opposing sides of said depression.

3. The method of claim 2, further comprising:

providing an electrical contact on said edge of said electrode.

4. The method of claim 3, further comprising:

joining said thermionic converter with one or more of said thermionic converters to form an array in which said electrical contacts of said thermionic converters are joined.

5. The method of claim 2 comprising:

forming said channel by sawing into said electrode; and filling a center of said channel with solder.

6. The method of claim 1, wherein said step of creating a central depression comprises creating a shallow central depression.

7. The method of claim 1, wherein said step of creating said central depression is done using a micromachining technique.

8. The method of claim 1, wherein said step of coating said surface is done using a micromachining technique.

9. The method of claim 1, wherein said step of creating a central depression, further comprises:

forming an oxide layer on said face of said electrode; and dissolving said oxide layer leaving said central depression in said electrode.

10. The method of claim 1, wherein said step of creating a central depression, further comprises:

creating said central depression of substantially uniform depth on said face of said electrode with saw cuts.

11. The method of claim 1, wherein said step of creating said central depression, further comprises:

coating said surface of said central depression by vacuum deposition.

12. The method of claim 1, wherein said thermionic material is silver and said silver is deposited using vacuum deposition.

13. The method of claim 1, further comprising oxidizing said thermionic material by heating said electrode in the presence of oxygen.

14. The method of claim 1, wherein said thermionic converter device is designed using MicroElectroMechanical Systems.

15. The method of claim 1, further comprising doping said electrode.

16. A method for building a thermionic converter using a micromachining technique comprising the steps of:

providing an electrode;

creating a central depression of substantially uniform depth on a face of said electrode using a micromachining technique;

coating a surface of said central depression with a layer comprising a thermionic material; and providing a second electrode comprising a face, wherein said face of said second electrode comprises a central depression of substantially uniform depth, wherein said central depression of said second electrode is coated with a layer comprising a thermionic material.

17. The method of claim 16, further comprising:

creating an edge region on said first electrode, wherein said edge region comprises a channel cut along two opposing sides of said depression on said first electrode; and creating an edge region on said second electrode, wherein said edge region comprises a channel cut along two opposing sides of said depression on said second electrode.

18. The method of claim 17, further comprising:

joining said first electrode with said second electrode, wherein said edge region in said first electrode is in contact with said edge region in said second electrode.

19. The method of claim 18, further comprising:

providing a gap between said thermionic material on said first electrode and said thermionic material on said second electrode.

20. The method of claim 19, wherein said gap is 1.0 $\mu$m or less.

21. The method of claim 19, further comprising adding cesium vapor into said gap.

22. The method of claim 19, further comprising evacuating said gap.

23. The method of claim 17, wherein said first electrode and said second electrode are connected by a micromachining process comprising the steps of:

contacting said edge regions of said first electrode and said second electrode; and fusing said first electrode and said second electrode by heating said electrodes.

24. The method of claim 17 wherein an evacuated gap is formed by a micromachining process comprising the steps:

contacting said edge regions of said first electrode and said second electrode;

providing a gap between said thermionic material on said first electrode and said thermionic material on said second electrode;

providing oxygen in said gap;

fusing said first electrode and said second electrode by heating said electrodes;

reacting said oxygen in said gap with said thermionic material, wherein said oxygen is depleted leaving said gap evacuated.

25. The method of claim 16, wherein said thermionic material on said first electrode is silver and said thermionic material on said second electrode is tungsten overlaid with thorium.

26. The method of claim 25, wherein said thermionic material on said second electrode is coated by a micromachining process comprising vacuum deposition of tungsten followed by a second micromachining process comprising vacuum deposition of thorium.

27. A method for converting heat to electricity comprising:

providing a thermionic converter comprising:

a first electrode, wherein a face of said first electrode comprises a central depression of substantially uniform depth, wherein said first electrode further comprises a coating of thermionic material on said central depression;

an edge region on said first electrode comprising a channel cut along two opposing sides of said central depression;

a second electrode, wherein a face of said second electrode comprises a central depression of substantially uniform depth, wherein said second electrode further comprises a coating of thermionic material; and an edge region on said second electrode comprising a channel cut along two opposing sides of said central depression, wherein said first electrode is joined with said second electrode wherein said edge region in said first electrode is in contact with said edge region in said second electrode;

providing a gap between said thermionic material on said first electrode and said thermionic material on said second electrode;

connecting an electrical load to said thermionic converter; and allowing electrons to flow from said thermionic material of said first electrode to said thermionic material of said second electrode.

28. The method of claim 27 further comprising:

dissipating heat by said thermionic converter; and generating electricity by said thermionic converter.

* * * * *